(12) United States Patent
Leung et al.

(10) Patent No.: US 7,155,173 B2
(45) Date of Patent: Dec. 26, 2006

(54) METHOD AND SYSTEM FOR PROVIDING A CONTEXT FOR MESSAGE COMPRESSION

(75) Inventors: Ka Cheong Leung, Irving, TX (US); Khiem Le, Coppell, TX (US); Zhigang Liu, Irving, TX (US); Christopher Clanton, Richardson, TX (US)

(73) Assignee: Nokia Corporation, Espoo (FI)

( * ) Notice: Subject to any disclaimer, the term of this patent is extended or adjusted under 35 U.S.C. 154(b) by 448 days.

(21) Appl. No.: 10/024,412

(22) Filed: Dec. 17, 2001

(65) Prior Publication Data

US 2002/0132613 A1 Sep. 19, 2002

Related U.S. Application Data

(60) Provisional application No. 60/275,678, filed on Mar. 14, 2001, provisional application No. 60/277,344, filed on Mar. 19, 2001, provisional application No. 60/277,509, filed on Mar. 21, 2001.

(51) Int. Cl.
*H04B 1/00* (2006.01)
*H04Q 7/20* (2006.01)
*H04M 7/00* (2006.01)
*G06F 15/00* (2006.01)

(52) U.S. Cl. ............... 455/72; 455/466; 455/432.2; 455/432.3; 341/106; 704/10; 709/247

(58) Field of Classification Search ............. 455/426, 455/412.1, 410, 466, 72, 266, 433, 414.2; 341/106, 51; 704/10, 230, 500–504; 715/532; 709/247

See application file for complete search history.

(56) References Cited

U.S. PATENT DOCUMENTS

| | | | |
|---|---|---|---|
| 5,323,155 A | 6/1994 | Iyer et al. ............. 341/51 |
| 5,521,940 A | 5/1996 | Lane et al. ............. 375/240 |
| 5,831,558 A | 11/1998 | Harvell ............. 341/106 |
| 5,951,623 A * | 9/1999 | Reynar et al. ............. 708/203 |
| 5,953,503 A | 9/1999 | Mitzenmacher et al. ............. 395/200.33 |
| 6,085,069 A | 7/2000 | Sharpe ............. 455/31.3 |
| 6,112,244 A * | 8/2000 | Moore et al. ............. 709/228 |
| 6,292,115 B1 * | 9/2001 | Heath ............. 341/87 |
| 6,414,610 B1 * | 7/2002 | Smith ............. 341/106 |
| 6,883,035 B1 * | 4/2005 | Hannu et al. ............. 709/247 |
| 2002/0058501 A1 * | 5/2002 | Hannu et al. ............. 455/422 |
| 2002/0115407 A1 * | 8/2002 | Thompson et al. ............. 455/3.01 |
| 2003/0097474 A1 * | 5/2003 | Defosse et al. ............. 709/246 |
| 2003/0233478 A1 * | 12/2003 | Chuah et al. ............. 709/247 |

FOREIGN PATENT DOCUMENTS

| | | |
|---|---|---|
| EP | 0 933 876 A1 | 8/1999 |
| WO | WO 98/05176 | 2/1998 |

* cited by examiner

*Primary Examiner*—Duc M. Nguyen
(74) *Attorney, Agent, or Firm*—Robert M. Bauer; Lackenbach Siegel, LLP

(57) ABSTRACT

A method for providing wireless communication between a mobile station and a network station using a context for message compression is provided. Profile-specific information is stored persistently in a profile-specific dictionary. Communication is then provided between the mobile station and the network station using the profile-specific dictionary for message compression.

27 Claims, 10 Drawing Sheets

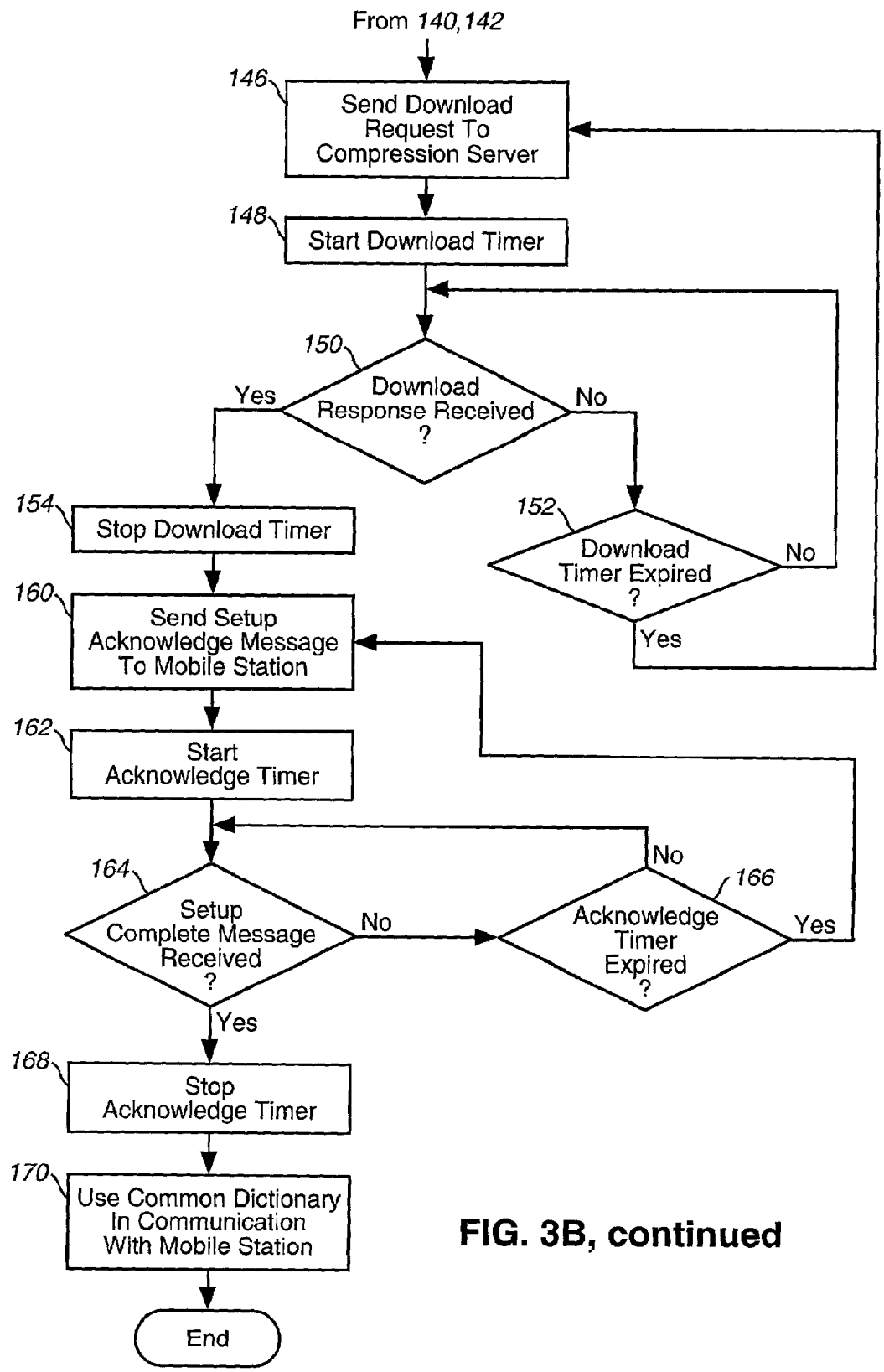
FIG. 3B, continued

METHOD AND SYSTEM FOR PROVIDING A CONTEXT FOR MESSAGE COMPRESSION

CROSS-REFERENCE TO RELATED APPLICATIONS

The present invention claims the priority of provisional patent application No. 60/275,678, filed on Mar. 14, 2001, provisional patent application No. 60/277,344, filed on Mar. 19, 2001, and provisional patent application No. 60/277,509, filed on Mar. 21, 2001, the contents of which are each incorporated herein.

TECHNICAL FIELD OF THE INVENTION

The present invention relates generally to message compression and more particularly to a method and system for providing a context, which is a dictionary and/or code related to the dictionary, for message compression.

BACKGROUND OF THE INVENTION

Many types of communication systems have been developed and implemented to effectuate communication of data between two or more sending and receiving stations. In some communication systems, the communication channel interconnecting the sending and receiving stations is formed of a radio channel defined upon a portion of the electromagnetic spectrum. A communication system utilizing radio channels is referred to as a radio communication system.

A cellular communication system is a type of radio communication system which has achieved wide levels of usage and has been installed throughout large geographical areas of the world. Advancements in communication technologies have permitted the development of successive generations of cellular communication systems. Reference is commonly made to at least three generations of cellular communication systems. First generation cellular communication systems generally include cellular communication systems which utilize analog modulation techniques, such as an Advanced Mobile Phone Service cellular communication system. Second generation cellular communication systems typically include cellular communication systems which utilize digital, multiple-access communication schemes, such as a Global System for Mobile communications cellular communication system or an Interim Standard—1995, Code-Division, Multiple-Access cellular communication system. Third generation cellular communication systems typically include cellular communication systems intended to provide universal communication services, including data services, voice services, and multi-media services.

At least one type of third generation cellular communication system includes an Internet protocol-based radio system that uses a text-based signaling protocol. In particular, this type of system may use a Session Initiation Protocol (SIP), which is a text-based protocol, as a call signaling protocol, e.g., to effectuate call set-up procedures between an access network and a core network. Other text-based protocols which may be used include Session Description Protocol, Real Time Streaming Protocol, and Hyper Text Transfer Protocol.

Cellular communication systems and, more generally, many other radio communication systems, are bandwidth-constrained. That is to say, the portion of the electromagnetic spectrum available to a communication system upon which to define radio channels is limited. The limited radio channel capacity may limit the communication capacity of the communication system. To overcome this problem, compression and decompression techniques have been developed to allow compression of the signaling protocol messages prior to their communication upon the radio channel and decompression subsequent to their communication.

One set of compression and decompression techniques is dictionary-based. That is to say, dictionary devices are positioned at both a sending entity and a receiving entity. Each dictionary device includes a memory element populated with messages such that the sending entity may detect repetition of strings between a current message and the dictionary and communicate those strings by sending reference values for the dictionary instead of the strings themselves. The receiving entity may recover the original message by replacing the reference values with the strings in its dictionary to which those reference values refer.

One problem associated with conventional dictionary-based techniques relates to compression efficiency at the beginning of a communication session. These techniques typically maintain the dictionary devices dynamically such that the content of the dictionary devices is gradually built up during the message transmission process. Thus, the dictionary devices have no information at the beginning of a session, resulting in extremely low compression efficiency during the initial phases of the session while the content is being built up. To overcome this problem, some dictionary-based techniques have used a static dictionary device that includes protocol-specific information to improve the initial efficiency of the technique. However, the use of such a static dictionary has provided only limited improvement in compression efficiency.

Another problem with conventional dictionary-based techniques involves dictionary synchronization. In order to function properly, the sending and receiving entities populate each of their dictionary devices with the same messages in the same order. If such dictionary synchronization is lost due to message misordering, message loss, or other coherency problems, the entities will be unable to communicate properly using compressed messages. One solution to this problem has been to discard the dictionaries at both the sending and receiving entities and rebuild the dictionaries. However, as discussed above, compression efficiency is low while the dictionaries are being built up.

SUMMARY OF THE INVENTION

In accordance with the present invention, a method and system for providing a context, which is a dictionary and/or code related to the dictionary, for message compression are provided that substantially eliminate or reduce disadvantages and problems associated with conventional systems. In particular, a profile-specific dictionary is maintained across communication sessions to improve initial compression efficiency, and synchronized dictionaries are stored periodically to improve compression efficiency in the event that synchronization is lost. Furthermore, the same mechanisms in the method and system can be used to setup code or instructions that perform dictionary pre-population, dictionary update and decompression of messages using the dictionary.

According to one embodiment of the present invention, a method for providing wireless communication between a mobile station and a network station using a context for message compression is provided. Profile-specific information, including a profile-specific dictionary and code, are stored persistently. Communication is then provided between the mobile station and the network station using the profile-specific context for message compression.

According to another embodiment of the present invention, a method for providing a context for message compression is provided. A setup message is received from a mobile station. A search is made for a common context based on the setup message. An attempt is made to validate the common context when the common context is found. A common context identifier associated with the common context is provided to the mobile station when the common context is validated. The common context is used to communicate with the mobile station.

According to yet another embodiment of the present invention, a station for providing wireless communication using message compression is provided. The station includes a dictionary module, a compressor, and a decompressor. The dictionary module is operable to store a plurality of dictionaries. Each of the dictionaries is operable to store a plurality of signaling message strings. One of the dictionaries comprises a profile-specific dictionary. The compressor is coupled to the dictionary module. The compressor is operable to generate a first reference value corresponding to a first string in a first signaling message that is to be communicated and to communicate the first reference value instead of the first string. The decompressor is coupled to the dictionary module. The decompressor is operable to receive a second reference value and to recover a second string in a second signaling message based on the second reference value.

According to still another embodiment of the present invention, a method for synchronizing dictionaries for message compression between a first station and a second station is provided. A rollback initiating event is identified at the first station. A checkpoint dictionary is selected at the first station based on the rollback initiating event. An index value is communicated from the first station to the second station. The index value is operable to identify the checkpoint dictionary. The checkpoint dictionary is used for message compression.

According to still another embodiment of the present invention, another method for synchronizing dictionaries for message compression between a first station and a second station is provided. A checkpoint initiating event is identified at the first station. A checkpoint dictionary is stored at the first station based on the checkpoint initiating event. A checkpoint initiation is sent from the first station to the second station. The checkpoint initiation comprises an index value operable to identify the checkpoint dictionary.

According to yet another embodiment of the present invention, a dictionary module for providing message compression for wireless communication between a mobile station and a network station is provided. The dictionary module includes a dynamic dictionary and a profile-specific dictionary. The dynamic dictionary is operable to store signaling messages exchanged between the mobile station and the network station during a particular communication session. The profile-specific dictionary is operable to store persistently signaling messages related to a profile for the mobile station.

Technical advantages of one or more embodiments of the present invention include providing an improved method for providing a dictionary for message compression. In a particular embodiment, the amount of information to be transmitted over the air interface is reduced through the use of a profile-specific context that is maintained from previous communication sessions. As a result, bandwidth variations which can occur with the use of only dynamic or dynamic/ static dictionaries are minimized and compression efficiency during early phases of a communication session is improved. Accordingly, call setup times are reduced and media quality is increased as there is no need to steal or blank media bits to carry signaling messages.

In addition, in a particular embodiment, the dictionaries maintained from the previous communication sessions are synchronized during the previous sessions. As a result, the dictionaries do not have to be quickly synchronized at the beginning of each new communication session. Accordingly, reasonable compression efficiency may be achieved even in the absence of the ability to complete a full dictionary synchronization procedure.

Technical advantages of one or more embodiments of the present invention also include providing an improved method for resynchronizing dictionaries for message compression. In a particular embodiment, checkpoint dictionaries that include copies of synchronized dictionaries are stored periodically. As a result, if synchronization is lost, previously stored checkpoint dictionaries may be used to replace the unsynchronized dictionaries. Accordingly, compression efficiency is significantly increased as compared to the compression efficiency of a system that flushes the unsynchronized dictionaries and, therefore, has to rebuild the dictionaries from scratch.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE DRAWINGS

Figure 1:
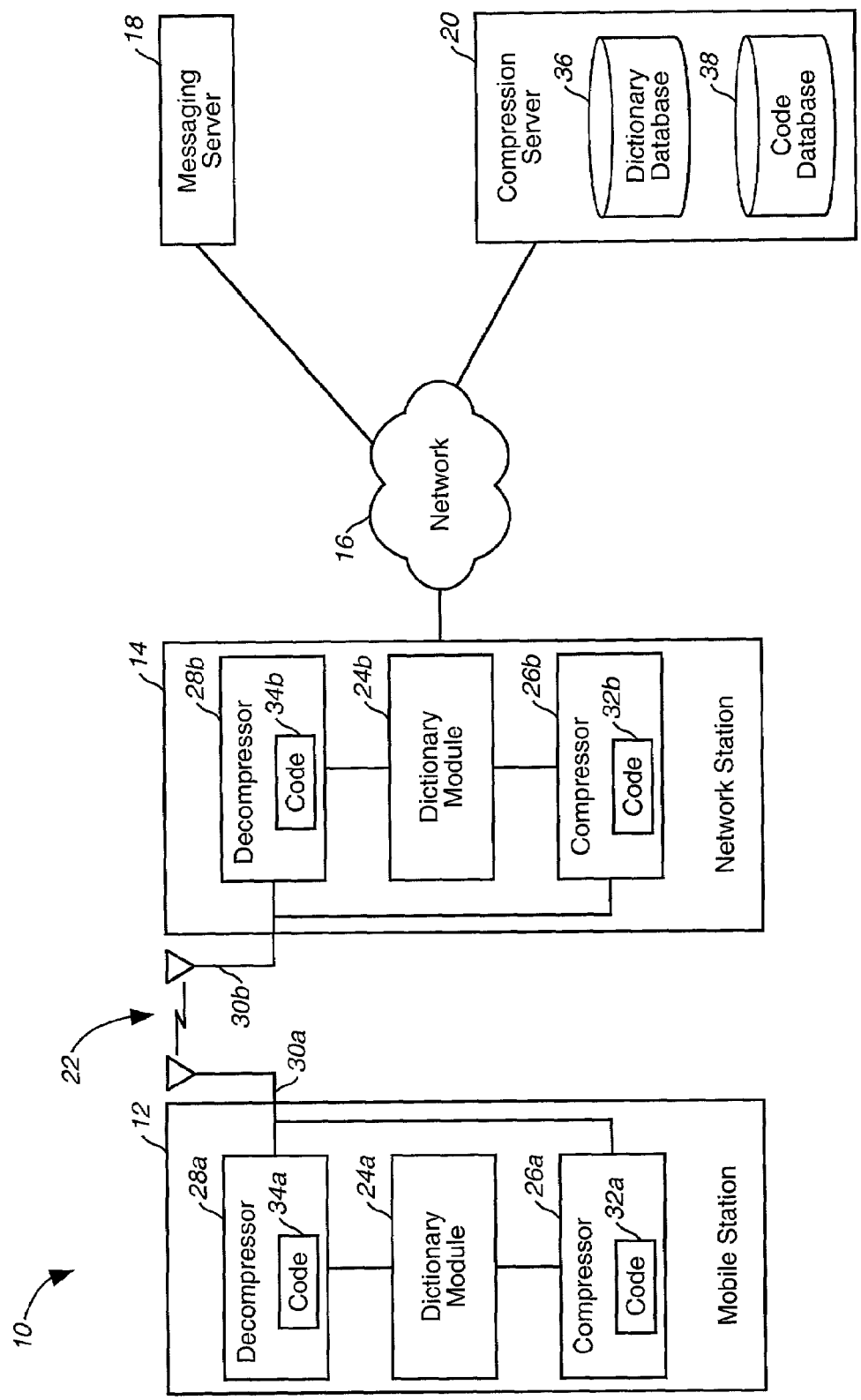
FIG. 1 is a block diagram illustrating a communication system operable to provide a context for message compression in accordance with one embodiment of the present invention.

FIG. 1 is a block diagram illustrating a communication system 10 operable to provide a context for message compression in accordance with one embodiment of the present invention. As used herein, "context" means a dictionary and/or code related to the dictionary. According to one embodiment, the system 10 is operable to provide communication using a third generation (3G) Internet protocol (IP) cellular communication standard. However, it will be understood that the system 10 may be operable to provide communication using any suitable radio communication standard in which a signaling protocol, such as a text-based or binary protocol, is utilized. Thus, while the following description of the illustrated embodiment is based on a 3G, IP cellular communication system 10, the invention may be similarly implemented in any suitable radio communication system.

The communication system 10 comprises a plurality of mobile stations 12 for providing wireless communication for users of the mobile stations 12, a plurality of network stations 14 for providing communication for mobile stations 12 located in a specified geographical area, a network 16 for coupling the network stations 14 to each other and to a plurality of servers, a messaging server 18 for providing messaging services for the system 10, and a compression server 20 for providing compression services for the system 10. It will be understood that the system 10 may comprise any other suitable components of a wireless communication system, such as other suitable servers coupled to the network 16, without departing from the scope of the present invention.

Each mobile station 12 may comprise a cellular telephone or other suitable device capable of providing wireless communication. As used herein, "each" means every one of at least a subset of the identified items. Each mobile station 12 is operable to communicate with a network station 14 over a wireless interface 22. The wireless interface 22 is operable to transfer messages between a mobile station 12 and a network station 14. The wireless interface 22 may comprise communication channels defined upon radio links, such as an Enhanced Data for GSM (Global System for Mobile communications) Evolution interface, a Wideband Code Division Multiple Access interface, or any other suitable interface.

Each network station 14 is operable to provide mobile stations 12 with access to voice and/or data networks by providing voice and/or data messages received from the mobile stations 12 to the network 16 and messages received from the network 16 to the mobile stations 12. The network 16 may comprise a packet data network, such as the Internet, or other suitable network. According to one embodiment, the network station 14 comprises a base station for a public land mobile network.

According to the illustrated embodiment, both the mobile station 12 and the network station 14 comprise a dictionary module 24, a compressor 26, a decompressor 28 and a transceiver 30 for communicating with each other. In an alternative embodiment, the functionality of the dictionary module 24b, the compressor 26b and/or the decompressor 28b of the network station 14 may be located elsewhere in the system 10. Additionally, the functionality of these components 24b, 26b and/or 28b may be provided at distributed locations throughout the system 10.

In another embodiment, the mobile station 12 and/or the network station 14 may comprise only one of the compressor 26 and the decompressor 28. However, if both the mobile station 12 and the network station 14 comprise only one of the compressor 26 and the decompressor 28, then one of the stations 12 or 14 comprises the compressor 26 and the other station 12 or 14 comprises the decompressor 28.

The dictionary module 24 is operable to store a plurality of signaling messages that may be compressed by the compressor 26 and/or decompressed by the decompressor 28. As described in more detail below in connection with FIG. 2, the dictionary module 24 comprises a profile-specific dictionary that is operable to store persistently signaling messages that are specific to a profile for a specific mobile station 12 and/or a user of a mobile station 12. As used herein, "to store persistently" means to store from one communication session to another, subsequent communication session.

The dictionary modules 24a and 24b are operable to be synchronized with each other to allow the mobile station 12 and the network station 14 to communicate using compressed messages. The dictionary modules 24a and 24b are "synchronized" with each other when the dictionary modules 24a and 24b contain the same content in the same order. The system 10 is operable to verify synchronization of the dictionary modules 24a and 24b and to synchronize the dictionary modules 24a and 24b when appropriate, as described in more detail below in connection with FIGS. 3–5, to ensure proper communication between the mobile station 12 and the network station 14.

The compressor 26 and the decompressor 28 are each operable to provide communication using compressed signaling protocol messages. Signaling protocol messages may be generated during call setup, maintenance, or disconnect procedures, or during other communication procedures of the system 10.

In accordance with one embodiment of the present invention, the system 10 provides communication using Session Initiation Protocol (SIP). However, it will be understood that the system 10 may provide communication using Session Description Protocol, Real Time Streaming Protocol, Hyper Text Transfer Protocol, or any other suitable protocol without departing from the scope of the present invention.

An SIP message is typically about 200–500 bytes in length. Communication of uncompressed SIP messages would, thus, result in significant usage of the bandwidth capacity available on the wireless interface 22 and also unacceptable latency during call setup and other communication procedures. Therefore, to reduce the amount of bandwidth used and decrease latency during communication procedures, the compressor 26 and the decompressor 28, in conjunction with the dictionary module 24, may use a compression algorithm, such as a Lempel-Ziv or other suitable algorithm, to communicate the SIP messages more efficiently.

According to one embodiment, the compressor 26 comprises compression code 32 for compressing the messages according to a specified compression algorithm, such as a Lempel-Ziv or other suitable algorithm, and the decompressor 28 comprises decompression code 34 for decompressing the messages according to the specified compression algorithm. It will be understood that the compression code 32 and the decompression code 34 may be implemented in a single code that is accessible by both the compressor 26 and the decompressor 28 without departing from the scope of the present invention. In addition, the compression/decompression code 32 and 34 may comprise dictionary initialization/pre-population procedures that run once before any message is compressed or decompressed.

The compressor 26 is coupled to the dictionary module 24 and is operable to access the dictionary module 24 in order to search for redundancy (i.e., repeated strings) between a message that is to be communicated and the content of the dictionary module 24. The compressor 26 is also coupled to the transceiver 30 and is operable, upon finding redundancy between the message and content of the dictionary module 24, to generate reference values associated with the repeated strings in the message and to provide the reference values to the transceiver 30 for transmission over the wireless interface 22. According to one embodiment, a reference value may comprise a pointer to a memory location in the dictionary module 24 corresponding to the beginning of a string in the message and a length corresponding to the length of the string. However, it will be understood that the reference value may comprise any other suitable information operable to identify the string in the dictionary module 24.

The decompressor 28 is coupled to the transceiver 30 and is operable to receive a reference value over the wireless interface 22 from the transceiver 30. The decompressor 28 is also coupled to the dictionary module 24 and is operable to access the dictionary module 24 in order to identify the string that is associated with the reference value that has been received.

Any or all of the dictionary module 24, the compressor 26, and the decompressor 28 may comprise logic encoded in media. The logic comprises functional instructions for carrying out program tasks. The media comprises computer disks or other computer-readable media, application-specific integrated circuits, field-programmable gate arrays, digital signal processors, other suitable specific or general purpose processors, transmission media or other suitable media in which logic may be encoded and utilized.

The messaging server 18 is coupled to the network 16 and is operable to provide messaging services for the system 10. Thus, for example, the messaging server 18 may be operable to receive an identifier for a mobile station 12 from a network station 14 and provide relevant data concerning the mobile station 12 and/or a user of the mobile station 12 to the network station 14 over the network 16, in addition to providing any other suitable services for the system 10.

The compression server 20 is coupled to the network 16 and is operable to provide compression services for the system 10. The compression server 20 comprises a dictionary database 36 that is operable to store a plurality of dictionaries for use in the system 10 and a code database 38 that is operable to store a plurality of codes for use in the system 10. As described in more detail below in connection with FIGS. 3A–C, the compression server 20 may be operable to provide one or more of the dictionaries stored in the dictionary database 36 to the network station 14 and may be operable to provide one of the codes stored in the code database 38 to the mobile station 12 and/or the network station 14. It will be understood that the dictionary database 36 and the code database 38 may comprise the same or separate databases without departing from the scope of the present invention.

The dictionary database 36 is operable to store a profile-specific dictionary for each of a plurality of mobile stations 12 and/or users of mobile stations 12. According to one embodiment, the compression server 20 is operable to update these profile-specific dictionaries upon the occurrence of a specified event, after the passage of a specified amount of time, or based on any other suitable trigger. The profile-specific dictionary for a mobile station 12 and/or a user of the mobile station 12 may be updated based on communication between the compression server 20 and the mobile station 12 through the network station 14 and/or based on communication between the compression server 20 and the messaging server 18 or other suitable server coupled to the network 16.

The code database 38 is operable to store compression codes 32 and decompression codes 34 for each of a plurality of compression algorithms. Each code 32 and 34 comprises a set of instructions that may be executed by the compressor 26 and/or the decompressor 28 to compress and/or decompress messages communicated between the stations 12 and 14 based on the corresponding algorithm. Each code 32 and 34 may also comprise instructions that may be executed by the compressor 26 and/or the decompressor 28 to initialize or pre-populate the dictionary module 24.

In operation, a mobile station 12 and a network station 14 begin a communication session. The network station 14, if possible, selects and validates a common dictionary for use in the dictionary modules 24a and 24b based on information received from the mobile station 12. However, if the network station 14 is unable to select and validate a common dictionary, the network station 14 may request from the compression server 20 a dictionary stored in the dictionary database 36. This ensures that the dictionary modules 24 are synchronized.

After synchronization of the dictionary modules 24, the compressor 26a of the mobile station 12 processes each signaling message being generated by the mobile station 12 to determine whether any string inside the message is stored in the dictionary module 24a. If any string inside a message is stored in the dictionary module 24a, the compressor 26a generates a reference value for the string. The compressor 26a then provides the reference value, instead of the string, to the transceiver 30a for communication over the wireless interface 22 to the transceiver 30b of the network station 14. For those strings that are not found in the dictionary module 24a, the compressor 26a provides them in uncompressed format to the transceiver 30a for communication over the wireless interface 22 to the transceiver 30b of the network station 14. Therefore, a compressed message that is transmitted over the air interface 22 generally comprises both uncompressed strings and compressed strings represented as reference values.

At the network station 14, the decompressor 28b processes the information received at the transceiver 30b. If a reference value is received, the decompressor 28b identifies the string associated with the reference value in the dictionary module 24b. The decompressor 28b then replaces the reference value with the string. If an uncompressed string is received, the decompressor 28b simply outputs the string. By repeating this procedure, the decompressor 28b recovers the original message as received by the compressor 26a. The decompressed message is then provided to the network station 14. It will be understood that a similar procedure may be implemented for communication of messages from the network station 14 to the mobile station 12.

In addition, the mobile station 12 and the network station 14 may implement a procedure similar to the dictionary synchronization procedure for downloading the codes 32a and 32b and the codes 34a and 34b. For example, the compressor 26a in the mobile station 12 may attempt to verify that code 34b is not empty and that it corresponds to the correct decompression algorithm for the current communication session before beginning communication of compressed messages. If that is not the case, the mobile station 12 may send a request to the network station 14 to download the code 34b comprising the correct algorithm from the code database 38 of the compression server 20.

Figure 2:
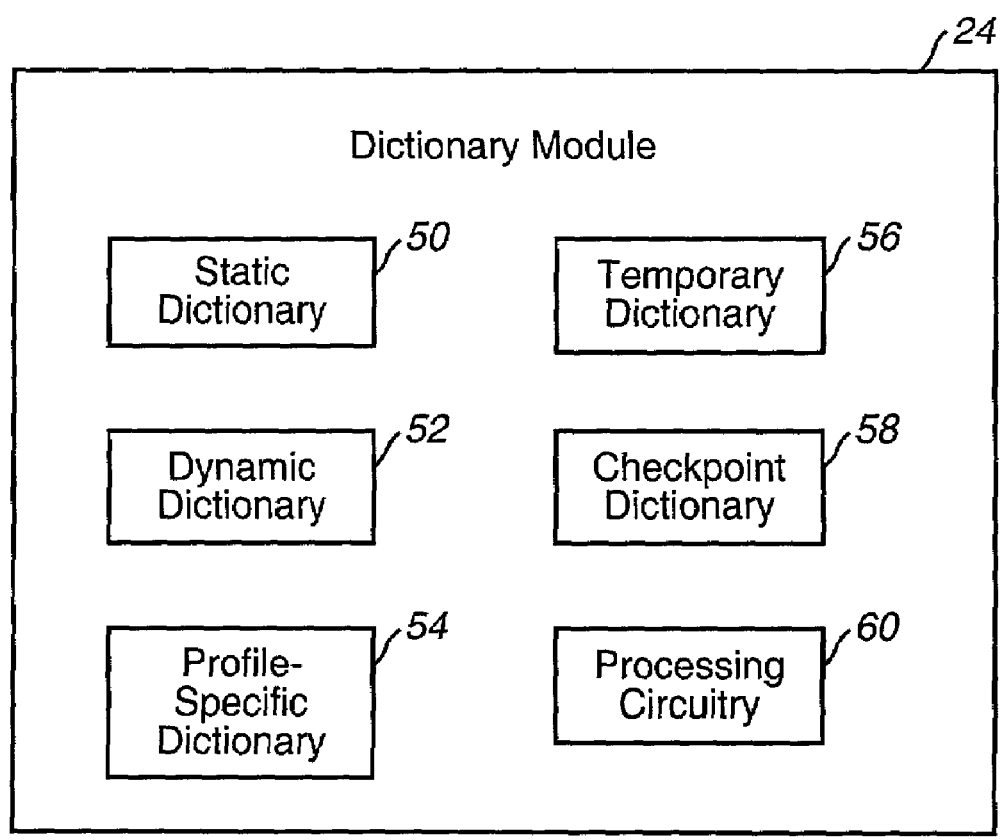
FIG. 2 is a block diagram illustrating details of the dictionary module of FIG. 1 in accordance with one embodiment of the present invention.

FIG. 2 is a block diagram illustrating details of the dictionary module 24 in accordance with one embodiment of the present invention. According to one embodiment, the dictionary module 24 comprises a static dictionary 50, a dynamic dictionary 52, and a profile-specific dictionary 54. The dictionary module 24 also comprises a temporary dictionary 56, a checkpoint dictionary 58, processing circuitry 60, and any other suitable components.

The static dictionary 50, the dynamic dictionary 52, the profile-specific dictionary 54, the temporary dictionary 56, and the checkpoint dictionary 58 may each comprise any suitable data store operable to store data related to compression and decompression of signaling messages, as described above in connection with FIG. 1. It will be understood that the static dictionary 50, the dynamic dictionary 52, the profile-specific dictionary 54, the temporary dictionary 56, and the checkpoint dictionary 58 may each comprise one or more dictionaries, each of which may be associated with a specified mobile station 12 and/or user of a mobile station 12.

The static dictionary 50 is operable to store persistently protocol-specific information, such as header field names and the like, relating to a communication protocol used by the corresponding mobile station 12 or network station 14. For example, for the embodiment in which the system 10 provides communication with SIP, the static dictionary 50 is operable to store SIP-specific information from one communication session to another. The protocol-specific information comprises signaling messages related to the protocol.

The dynamic dictionary 52 is operable to store signaling messages that have been exchanged previously between the mobile station 12 and the network station 14 during the current communication session. Thus, the dynamic dictionary 52 stores substantially no information at the beginning of a communication session. As messages are exchanged, however, the information stored in the dynamic dictionary 52 expands to include at least a portion of those messages.

The profile-specific dictionary 54 is operable to store persistently signaling messages that are specific to a profile for a specific mobile station 12 and/or a user of a mobile station 12. According to one embodiment, the profile-specific dictionary 54 may be operable to store signaling messages regarding device information and/or user information. For example, the profile-specific dictionary 54 may be operable to store signaling messages regarding device information, such as hardware capabilities for the mobile station 12. This device information may comprise voice codec type, bit rate, video codec picture size, image compression format, and the like. In addition, the profile-specific dictionary 54 may be operable to store signaling messages regarding user information, such as information related to services available to the user of the mobile station 12, address book information, a user name, a user e-mail address, and the like.

According to one embodiment, the signaling messages regarding user information may be stored in an identity module, such as a smartcard device, that is removable from the mobile station 12. In this embodiment, the profile-specific dictionary 54 may comprise both the removable identity module and a data store within the mobile station 12 for storing the signaling messages regarding device information.

In accordance with one embodiment of the present invention, the profile-specific dictionary 54 of the network station 14 may comprise a plurality of dictionaries, each corresponding to a mobile station 12 with which the network station 14 is communicating. In addition, the network station 14 may continue to store the dictionary for a specified mobile station 12 for use in multiple communication sessions with the specified mobile station 12 provided that space is available in the profile-specific dictionary 54 of the network station 14.

The temporary dictionary 56 is operable to store temporarily information used during message communication between the mobile station 12 and the network station 14. For example, when a particular message is sent from one station 12 or 14 to the other station 12 or 14, a copy of the message may be stored in the temporary dictionary 56 of the sender until an acknowledgement of the message is received by the sender from the recipient. In addition, a copy of the received message may be stored in the temporary dictionary 56 of the recipient until an acknowledgement of the acknowledgement is received by the recipient from the sender. It will be understood that the temporary dictionary 56 may be used to store temporarily any other suitable information without departing from the scope of the present invention.

The checkpoint dictionary 58 is operable to store at least one copy of the dynamic dictionary 52, along with a corresponding index value. As described in more detail below in connection with FIGS. 4–5, the checkpoint dictionary 58 may also store a copy of the profile-specific dictionary 54 and/or the temporary dictionary 56. However, the following description will assume that the checkpoint dictionary 58 simply stores a copy of the dynamic dictionary 52.

Either the mobile station 12 or the network station 14 may initiate a checkpoint procedure in which copies of the dynamic dictionaries 52 are stored at both the mobile station 12 and the network station 14, after the dynamic dictionaries 52 at each station 12 and 14 are validated through a determination that the dynamic dictionaries 52 are synchronized with each other. The checkpoint dictionary 58 stores the copy of the dynamic dictionary 52, along with an index value for identifying the copy.

If synchronization of the dynamic dictionaries 52 is subsequently lost, one of the stations 12 or 14 may communicate an index value for a checkpoint dictionary 58 to the other station 12 or 14. After validation of the checkpoint dictionaries 58 identified by the index value, each station 12 and 14 may then replace its current dynamic dictionary 52 with the checkpoint dictionary 58 identified by the index value, resulting in a resynchronization of the dynamic dictionaries 52.

The processing circuitry 60 comprises any suitable circuitry operable to perform dictionary maintenance for the dictionary module 24, including storing the dictionaries 50, 52, 54, 56 and 58, validating the dictionaries 50, 52, 54 and 58, and any other suitable dictionary maintenance procedures. The processing circuitry 60 is also operable to perform dictionary functions for the dictionary module 24, such as providing access to the dictionary module 24 to the compressor 26 and to the decompressor 28, in addition to any other suitable dictionary functions.

Figure 3A:
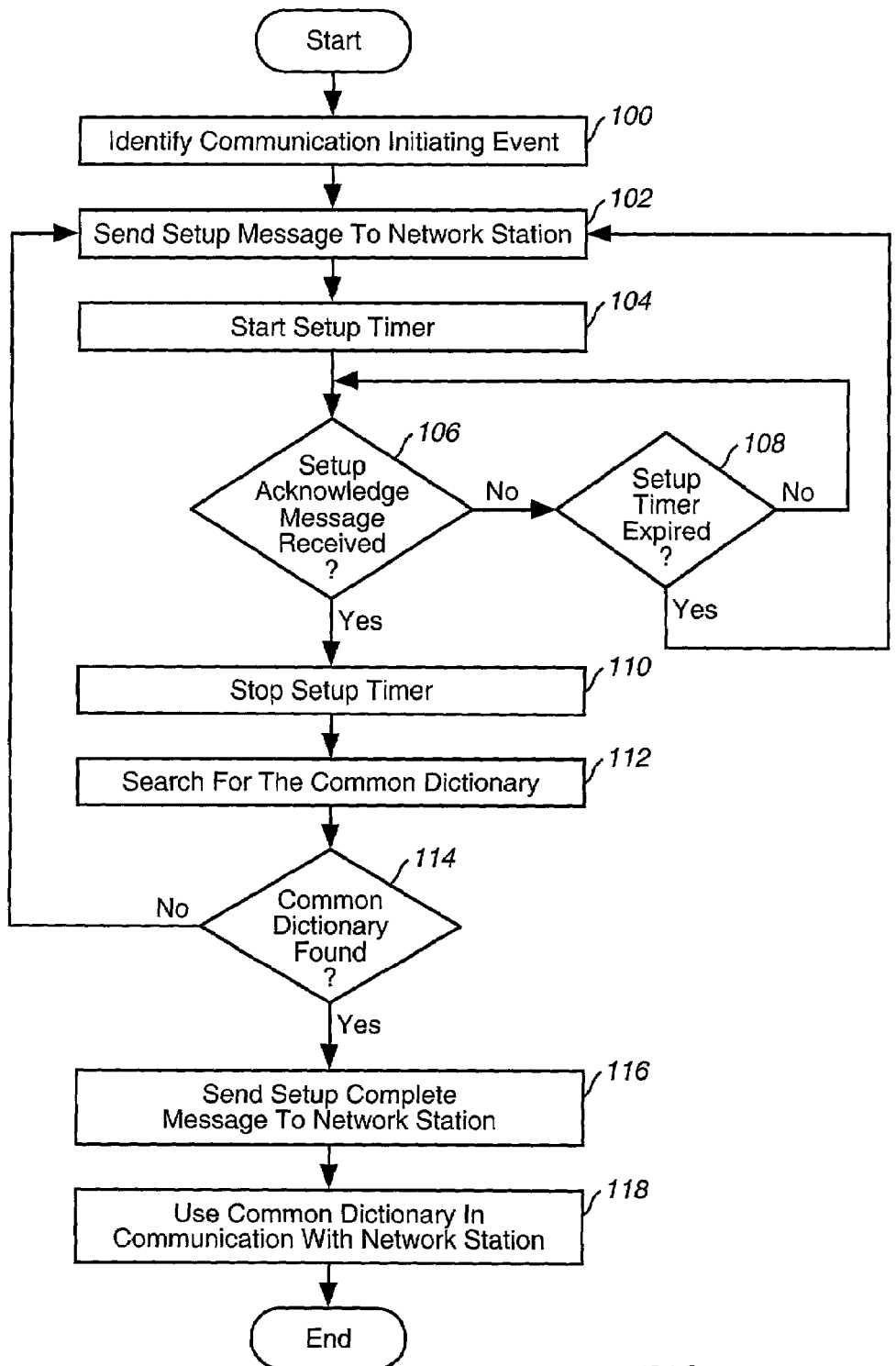
FIGS. 3A–C are flow diagrams illustrating a method for providing a context for message compression in the system of FIG. 1 in accordance with one embodiment of the present invention.
Figure 3B:
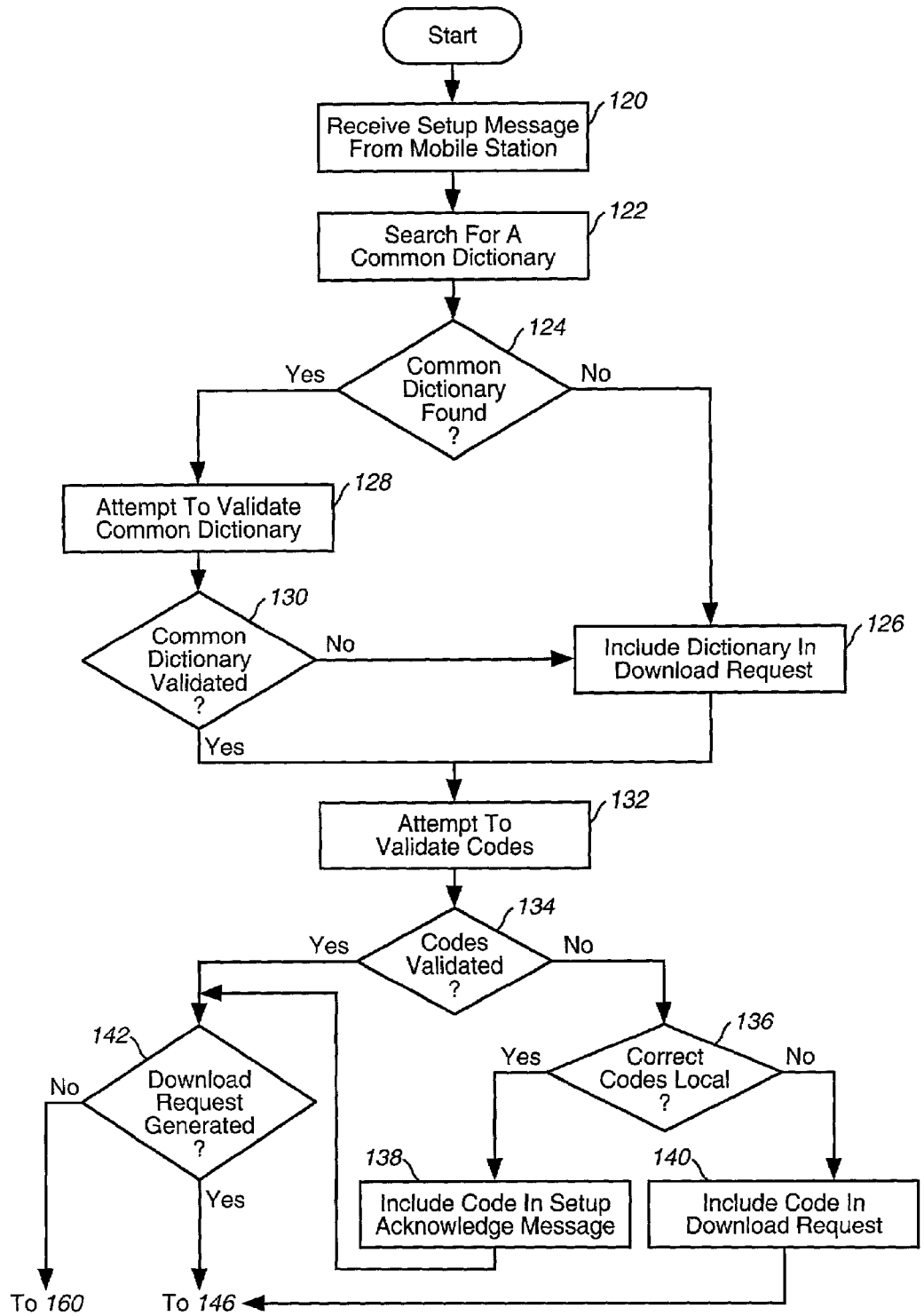
Figure 3C:
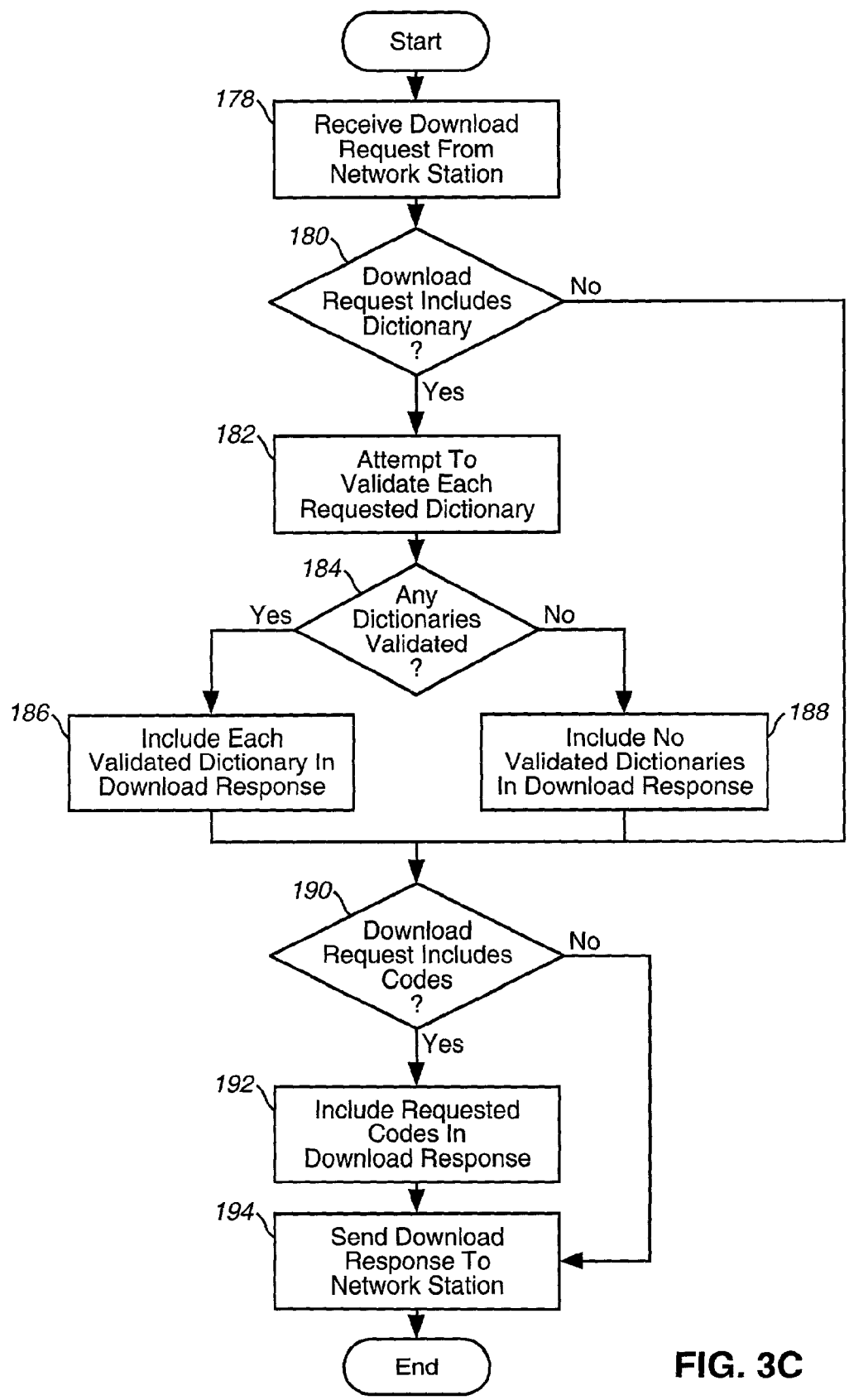

FIGS. 3A–C are flow diagrams illustrating a method for providing the dictionary module 24 and possibly codes 32 and/or 34 in accordance with one embodiment of the present invention. FIG. 3A illustrates the method from the perspective of the mobile station 12, FIG. 3B illustrates the method from the perspective of the network station 14, and FIG. 3C illustrates the method from the perspective of the compression server 20.

The method of FIG. 3A begins at step 100 where the mobile station 12 identifies a communication initiating event. According to one embodiment of the present invention, a communication initiating event may comprise the mobile station 12 being powered on, the mobile station 12 detecting that it has roamed into an area covered by a network station 14 different from the network station 14 with which the mobile station 12 was previously communicating, the network station 14 notifying the mobile station 12 that another entity is attempting to communicate with the mobile station 12, or any other suitable event resulting in a setup of communication between the mobile station 12 and the network station 14.

At step 102, the mobile station 12 sends a setup message to the network station 14. According to one embodiment, the setup message comprises an identifier for the mobile station 12 and/or for the user of the mobile station 12, a request to setup a communication session, a list of available dictionary types in order of preference, an error-detecting code for each available dictionary type, a code identifier for identifying the codes 32 and 34, if any, currently stored in the mobile station 12, and any other suitable information.

According to one embodiment, the available types of dictionaries may comprise a complete dictionary, which may include a static dictionary 50, a dynamic dictionary 52 and a profile-specific dictionary 54, a partial dictionary, which may include a static dictionary 50 and a profile-specific dictionary 54, or simply a static dictionary 50. It will be understood that the dictionary types may comprise any other suitable types without departing from the scope of the present invention. In addition, the error-detecting codes may comprise checksums, cyclic redundant codes, or other suitable error-detecting values. According to one embodiment, each error-detecting code comprises a cyclic redundant code of at least two to four bytes in length.

At step 104, the mobile station 12 starts a setup timer corresponding to predetermined amount of time during which the mobile station 12 expects to receive a response to the setup message from the network station 14. At decisional step 106, the mobile station 12 makes a determination regarding whether or not a setup acknowledge message has been received from the network station 14.

According to one embodiment, the setup acknowledge message comprises at least one common dictionary identifier corresponding to a common dictionary selected by the network station 14, in addition to any other suitable information. For example, the setup acknowledge message may also comprise codes 32a and/or 34a from the network station 14 itself or from the compression server 20. This may occur if the mobile station 12 has no code 32a and/or 34a or has an incorrect code 32a and/or 34a. In this situation, the mobile station 12 stores the code 32a and/or 34a received in the setup acknowledge message.

A common dictionary may comprise any one of the dictionaries whose types are specified in the setup message and which are synchronized with a corresponding dictionary. For example, the common dictionary may comprise a complete dictionary, a partial dictionary, a static dictionary 50, or any other suitable dictionary or combination of dictionaries that are synchronized with a corresponding dictionary or combination of dictionaries in the network station 14. If a setup acknowledge message has not been received from the network station 14, the method follows the No branch from decisional step 106 to decisional step 108.

At decisional step 108, the mobile station 12 makes a determination regarding whether or not the setup timer has expired. If the setup timer has not expired, the method follows the No branch from decisional step 108 and returns to decisional step 106 to determine whether or not a setup acknowledge message has been received.

However, if the setup timer has expired, the method follows the Yes branch from decisional step 108 and returns to step 102 where the mobile station 12 sends another setup message to the network station 14. In addition, a setup counter may be incremented each time the setup timer expires in order to limit the number of times a setup message is sent before an error message is generated to indicate that the procedure is not progressing.

Returning to decisional step 106, if the mobile station 12 determines that a setup acknowledge message has been received from the network station 14, the method follows the Yes branch from decisional step 106 to step 110. At step 110, the mobile station 12 stops the setup timer. At step 112, the mobile station 12 searches its dictionary module 24a for the common dictionary selected by the network station 14 and identified in the setup acknowledge message. According to one embodiment, the common dictionary is identified in the setup acknowledge message by its error-detecting code. However, it will be understood that the common dictionary may be otherwise suitably identified without departing from the scope of the present invention.

At decisional step 114, the mobile station 12 makes a determination regarding whether or not the common dictionary was found. If the common dictionary was not found, the method follows the No branch from decisional step 114 and returns to step 102 where the mobile station 12 sends another setup message to the network station 14. According to one embodiment, the setup counter may be incremented at this point. In an alternative embodiment, a separate counter may be incremented in order to identify the different point past which the procedure is unable to progress.

Returning to decisional step 114, if the mobile station 12 has found the common dictionary, the method follows the Yes branch from decisional step 114 to step 116. At step 116, the mobile station 12 sends a setup complete message to the network station 14. The mobile station 12 may also store the codes 32a and/or 34a if they are received in the setup acknowledge message. According to one embodiment, the setup complete message comprises an indication that the communication setup procedure has been completed successfully, in addition to any other suitable information. At step 118, the mobile station 12 uses the common dictionary in communication with the network station 14, at which point the method comes to an end.

The method of FIG. 3B begins at step 120 where the network station 14 receives the setup message from the mobile station 12. At step 122, the network station 14 searches for a common dictionary. According to one embodiment, the network station 14 may search for a common dictionary by searching the dictionary module 24b for dictionaries of the types specified in the setup message, in order of any preference that may have been provided in the setup message.

At decisional step 124, the network station 14 makes a determination regarding whether or not a common dictionary has been found. If no common dictionary has been found, the method follows the No branch from decisional step 124 to step 126. At step 126, the network station 14 generates a download request that includes at least one identifier to identify at least one type of dictionary that the network station 14 is requesting from the compression server 20, an error-detecting code for each dictionary type requested, and any other suitable information. For example, the network station 14 may request a dictionary of the type specified by the mobile station 12 in the setup message.

Returning to decisional step 124, if the network station 14 has found a common dictionary, the method follows the Yes branch from decisional step 124 to step 128. At step 128, the network station 14 attempts to validate the common dictionary. According to one embodiment, the network station 14 may attempt to validate the common dictionary by checking the error-detecting code for the common dictionary against the error-detecting code that was received from the mobile station 12 for the corresponding dictionary in the mobile station 12.

At decisional step 130, the network station 14 makes a determination regarding whether or not the common dictionary has been validated. If the common dictionary has not been validated, the method follows the No branch from decisional step 130 to step 126 where the network station 14 generates a download request that includes at least one identifier to identify at least one type of dictionary, as described above.

However, if the common dictionary has been validated, the method follows the Yes branch from decisional step 130 to step 132. Also, from step 126, the method proceeds to step 132. At step 132, the network station 14 attempts to validate the codes 32 and 34. According to one embodiment, the network station 14 may attempt to validate the code 34*b* by comparing the code identifier for code 32*a* (received in the setup message from mobile station 12) to the locally stored code identifier for code 34*b* to determine whether code 34*b* is the correct decompression code that matches the compression code 32*a*. (A decompression code x matches a compression code y if a message compressed using code y can be correctly decompressed using code x, and vice versa). Similarly, the network station 14 can verify if code 32*b* is the correct compression code that matches the decompression code 34*a*. In addition, the network station 14 may verify that the codes 32 and 34 comprise the correct algorithm for providing compressed communication between the mobile station 12 and the network station 14 based on any suitable criteria, such as processor capabilities, memory capacity, and the like.

At decisional step 134, the network station 14 makes a determination regarding whether or not the codes 32 and 34 have been validated by determining whether code 32*b* matches code 34*a* and code 34*b* matches code 32*a*, as described above in step 132. If the codes 32 and 34 do not match, the method follows the No branch from decisional step 134 to decisional step 136. At decisional step 136, the network station 14 makes a determination regarding whether or not the correct codes for correcting the mismatch are stored locally. For each mismatched pair of codes 32 and 34, the network station 14 may select between two options. If code 32*b* does not match code 34*a*, the network station 14 can either send the correct code 34*a* to the mobile station 12 or install the correct code 32*b* locally. Similarly, if code 34*b* does not match code 32*a*, the network station 14 can either send the correct code 32*a* to the mobile station 12 or install the correct code 34*b* locally. After the network station 14 selects an option for each mismatch, the network station 14 determines if the correct codes 32 and/or 34 are stored locally. (Note that the network station 14 may also use the availability of correct codes 32 and/or 34 as a factor when selecting between options for each mismatch). If the correct codes 32 and/or 34 are stored locally in the network station 14, the method follows the Yes branch from decisional step 136 to step 138. At step 138, the network station 14 includes the codes 32*a* and/or 34*a* (or neither code 32*a* and 34*a*, depending on which options were selected in step 136) in the setup acknowledge message for the mobile station 12.

Returning to decisional step 136, if the any of the correct codes (i.e., any combination of codes 32*a*, 34*a*, 32*b*, and 34*b*) are not stored locally in the network station 14, the method follows the No branch from decisional step 136 to step 140. At step 140, the network station 14 generates a download request, if one has not been generated previously in step 126, and includes code identifiers for the codes 32 and/or 34 that the network station 14 is requesting from the compression server 20, in addition to any other suitable information, in the download request.

Returning to decisional step 134, if the codes 32 and 34 have been validated (i.e., code 32*b* matches code 34*a* and code 34*b* matches code 32*a*), the method follows the Yes branch from decisional step 134 to decisional step 142. Also, from step 138, the method proceeds to decisional step 142. At decisional step 142, the network station 14 makes a determination regarding whether or not a download request has been generated. If a download request has been generated, the method follows the Yes branch from decisional step 142 to step 146. Also, from step 140, the method proceeds to step 146.

At step 146, the network station 14 sends the download request to the compression server 20 over the network 16. According to one embodiment, the download request comprises an identifier for the mobile station 12 and/or for the user of the mobile station 12, in addition to any requested dictionaries and codes (any combination of codes 32*a*, 34*a*, 32*b*, and 34*b*). At step 148, the network station 14 starts a download timer corresponding to a predetermined amount of time during which the network station 14 expects to receive a response to the download request from the compression server 20.

At decisional step 150, the network station 14 makes a determination regarding whether or not a download response has been received from the compression server 20. If no download response has been received, the method follows the No branch from decisional step 150 to decisional step 152.

At decisional step 152, the network station 14 makes a determination regarding whether or not the download timer has expired. If the download timer has not expired, the method follows the No branch from decisional step 152 and returns to decisional step 150 where the network station 14 determines whether or not a download response has been received.

However, if the download timer has expired, the method follows the Yes branch from decisional step 152 and returns to step 146 where the network station 14 sends another download request to the compression server 20 over the network 16. In addition, a download counter may be incremented each time the download timer expires in order to limit the number of times a download request is sent before an error message is generated to indicate that the procedure is not progressing.

Returning to decisional step 150, if the network station 14 has received a download response from the compression server 20, the method follows the Yes branch from decisional step 150 to step 154. At step 154, the network station 14 stops the download timer. According to one embodiment, the network station 14 may optionally validate the dictionaries received from the compression server 20 by checking their error-detecting codes against those received from the mobile station 12.

Returning to decisional step 142, if a download request has not been generated, the method follows the No branch from decisional step 142 to step 160. Also, from step 154, the method proceeds to step 160. At step 160, the network station 14 sends a setup acknowledge message to the mobile station 12. The setup acknowledge message comprises a common dictionary identifier that is operable to identify the validated common dictionary that was selected by the network station 14, in addition to any other suitable information, such as codes 32 and/or 34. The common dictionary identifier may comprise the error-detecting code for the common dictionary or any other suitable identifier. At step 162, the network station 14 starts an acknowledge timer corresponding to a predetermined amount of time during which the network station 14 expects to receive a response to the setup acknowledge message from the mobile station 12.

At decisional step 164, the network station 14 makes a determination regarding whether or not a setup complete message has been received from the mobile station 12 in response to the setup acknowledge message. If no setup complete message has been received, the method follows the No branch from decisional step 164 to decisional step 166.

At decisional step 166, the network station 14 makes a determination regarding whether or not the acknowledge timer has expired. If the acknowledge timer has not expired, the method follows the No branch from decisional step 166 and returns to decisional step 164 where the network station 14 determines whether or not the setup complete message has been received.

However, if the acknowledge timer has expired, the method follows the Yes branch from decisional step 166 and returns to step 160 where the network station 14 sends another setup acknowledge message to the mobile station 12. In addition, an acknowledge counter may be incremented each time the acknowledge timer expires in order to limit the number of times a setup acknowledge message is sent before an error message is generated to indicate that the procedure is not progressing.

Returning to decisional step 164, if the setup complete message has been received, the communication setup procedure has been completed successfully and the method follows the Yes branch from decisional step 164 to step 168. At step 168, the network station 14 stops the acknowledge timer. At step 170, the network station 14 uses the common dictionary in communication with the mobile station 12, at which point the method comes to an end.

The method of FIG. 3C begins at step 178 where the compression server 20 receives the download request from the network station 14 over the network 16. At decisional step 180, the compression server 20 makes a determination regarding whether or not the download request includes any dictionaries. If the download request includes any dictionaries, the method follows the Yes branch from decisional step 180 to step 182.

At step 182, the compression server 20 attempts to validate each dictionary of the types that have been requested by the network station 14 in the download request. According to one embodiment, the compression server 20 may attempt to validate each dictionary by checking the error-detecting code for the dictionary against the error-detecting code that was received from the network station 14 for that dictionary.

At decisional step 184, the compression server 20 makes a determination regarding whether or not any requested dictionaries have been validated. If at least one requested dictionary has been validated, the method follows the Yes branch from decisional step 184 to step 186. At step 186, the compression server 20 includes each validated dictionary in a download response.

Returning to decisional step 184, if no dictionary requested by the network station 14 has been validated, the method follows the No branch from decisional step 184 to step 188. At step 188, the compression server 20 indicates that no validated dictionaries are available in a download response.

Returning to decisional step 180, if the download request does not include any dictionaries, the method follows the No branch from decisional step 180 to decisional step 190. Also, from steps 186 and 188, the method proceeds to decisional step 190. At decisional step 190, the compression server 20 makes a determination regarding whether or not the download request includes any codes (i.e., any combination of codes 32a, 34a, 32b, and 34b). If the download request includes any codes, the method follows the Yes branch from decisional step 190 to step 192. At step 192, the compression server 20 includes each requested code (i.e., any requested combination of codes 32a, 34a, 32b, and 34b) in the download response.

Returning to decisional step 190, if the download request does not include any codes, the method follows the No branch from decisional step 190 to step 194. Also, from step 192, the method proceeds to step 194. At step 194, the compression server 20 sends the download response to the network station 14 over the network 16, at which point the method comes to an end.

Thus, in accordance with the method of FIGS. 3A–C, a common dictionary that has been synchronized previously may be identified by the stations 12 and 14 at the beginning of a new communication session. In this way, the stations 12 and 14 may begin communicating without having to quickly synchronize dictionaries, resulting in reasonable compression efficiency even in the absence of a full dictionary synchronization procedure. In addition, the amount of information to be transmitted over the wireless interface 22 is reduced through the use of a profile-specific dictionary 54, resulting in minimization of bandwidth variations and increased compression efficiency during early phases of a communication session. Furthermore, the compression and/or decompression code 32 and/or 34 can be synchronized in a similar way without actually transmitting the codes 32 and/or 34 over the wireless interface 22.

Figure 4A:
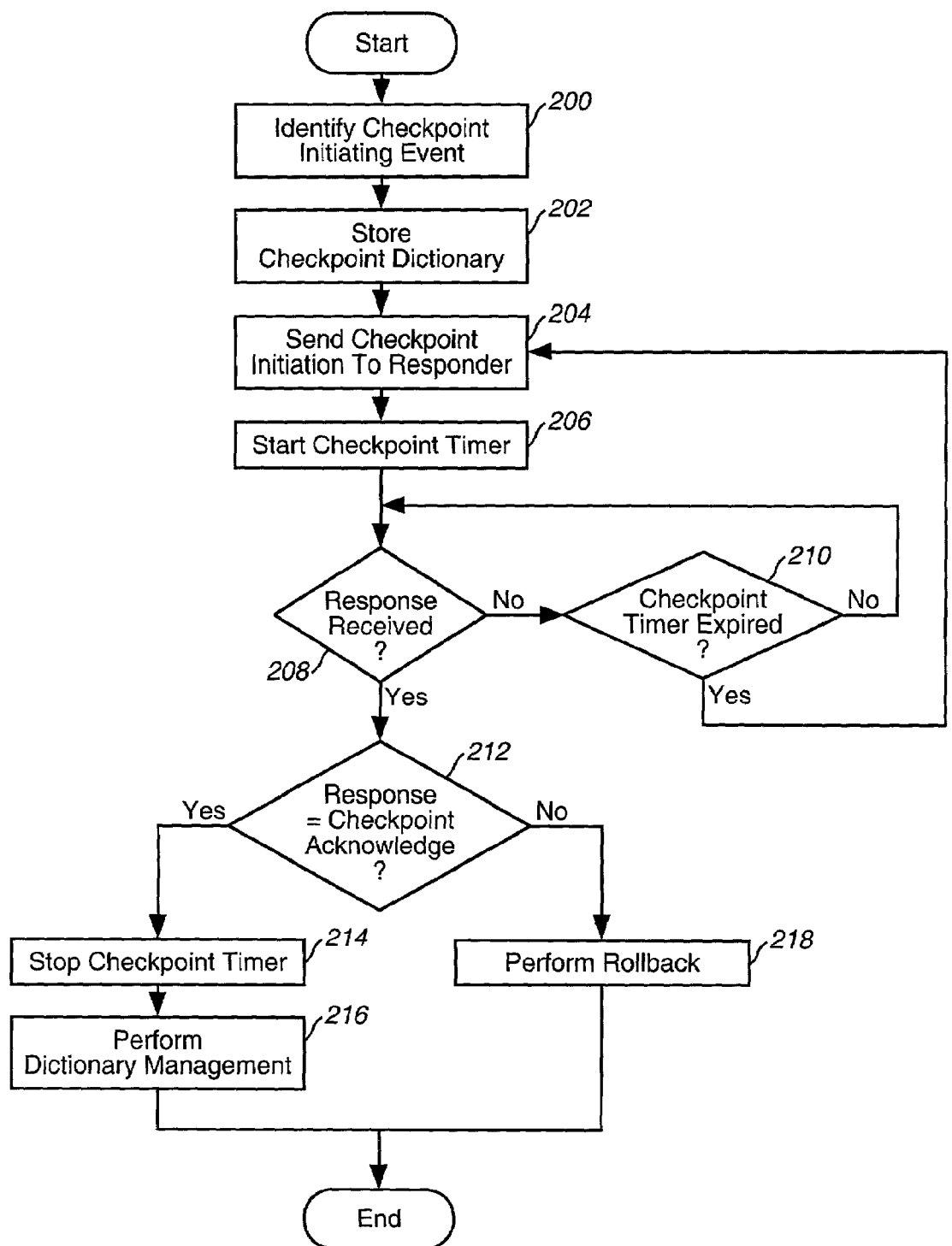
FIGS. 4A–B are flow diagrams illustrating a method for generating the checkpoint dictionary of FIG. 2 in accordance with one embodiment of the present invention.
Figure 4B:
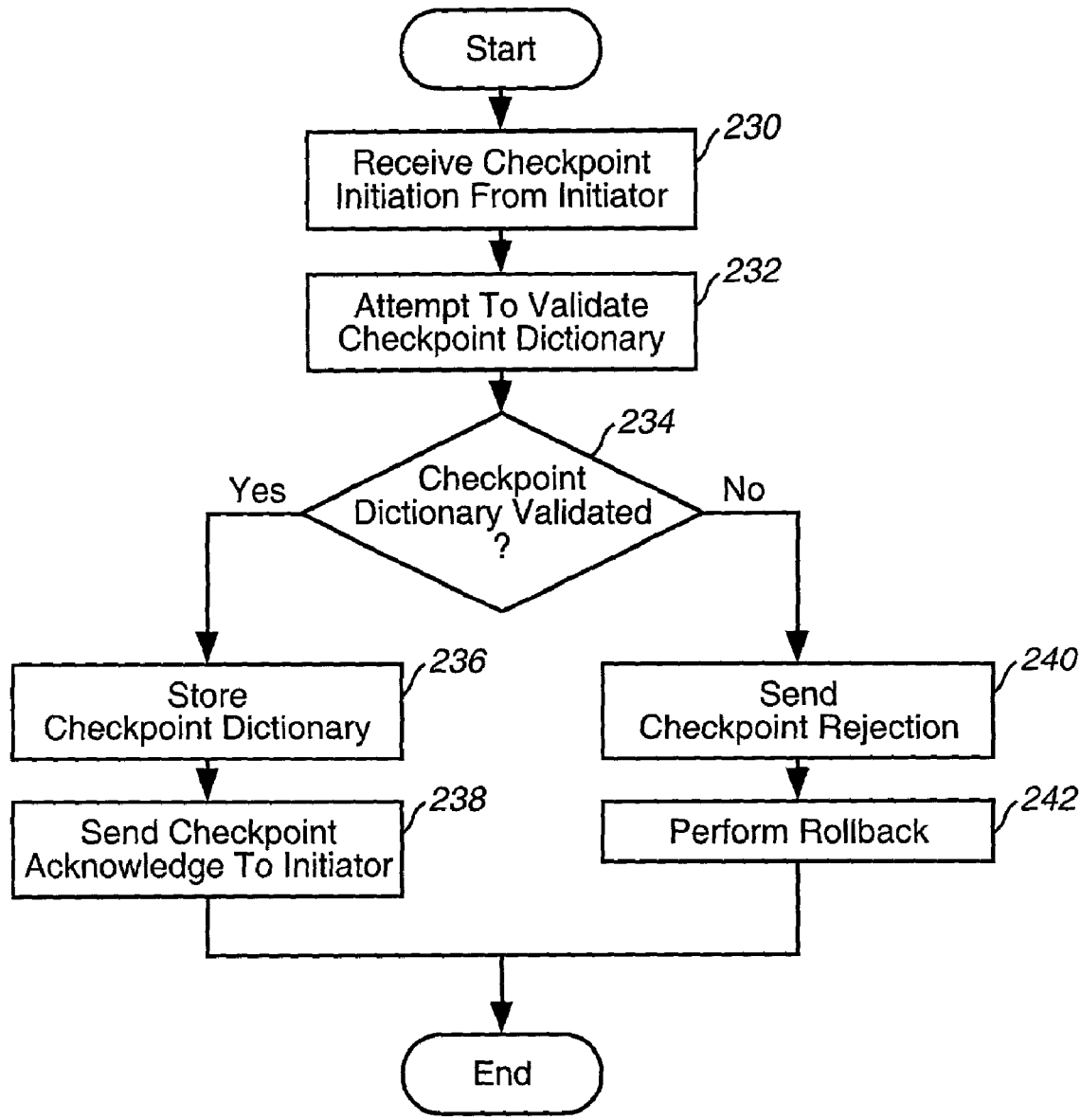

FIGS. 4A–B are flow diagrams illustrating a method for generating a checkpoint dictionary 58 in accordance with one embodiment of the present invention. FIG. 4A illustrates the method from the perspective of the initiator of the checkpoint procedure, and FIG. 4B illustrates the method from the perspective of the responder. For example, the mobile station 12 may initiate the procedure, making the mobile station 12 the initiator and the network station 14 the responder. Alternatively, the network station 14 may initiate the procedure, making the network station 14 the initiator and the mobile station 12 the responder.

The method of FIG. 4A begins at step 200 where the initiator identifies a checkpoint initiating event. According to one embodiment, a checkpoint initiating event may comprise an expiration of a timer such that the checkpoint procedure is initiated periodically based on a predetermined amount of time, a checkpoint initiation request generated by a user of the mobile station 12 and/or the network station 14, or any other suitable event.

At step 202, the initiator stores a checkpoint dictionary 58 in the dictionary module 24. The checkpoint dictionary 58 may comprise a copy of the dynamic dictionary 52, a copy of the dynamic dictionary 52 and the profile-specific dictionary 54, a copy of the dynamic dictionary 52 and the temporary dictionary 56, a copy of the dynamic dictionary 52, the profile-specific dictionary 54 and the temporary dictionary 56, or any other suitable combination of dictionaries. In addition, the checkpoint dictionary 58 comprises an index value corresponding to the particular version of the dictionary and/or dictionaries that have been stored. Thus, the checkpoint dictionary 58 may comprise a plurality of versions of the dictionary and/or dictionaries, each with a corresponding index value to identify the version.

At step 204, the initiator sends a checkpoint initiation to the responder. According to one embodiment, the checkpoint initiation comprises an index value to identify the version of the dictionary to be stored in the checkpoint dictionary 58, the error-detecting code for that version of the dictionary, and any other suitable information. At step 206, the initiator starts a checkpoint timer corresponding to a predetermined amount of time during which the initiator expects to receive a response to the checkpoint initiation from the responder.

At decisional step 208, the initiator makes a determination regarding whether or not a response has been received from the responder. If no response has been received, the method follows the No branch from decisional step 208 to decisional step 210. At decisional step 210, the initiator determines whether or not the checkpoint timer has expired. If the checkpoint timer has not expired, the method follows the No branch from decisional step 210 and returns to decisional step 208 where the initiator determines whether or not a response has been received.

However, if the checkpoint timer has expired, the method follows the Yes branch from decisional step 210 and returns to step 204 where the initiator sends another checkpoint initiation to the responder. In addition, a checkpoint counter may be incremented each time the checkpoint timer expires in order to limit the number of times a checkpoint initiation is sent before an error message is generated to indicate that the procedure is not progressing.

Returning to decisional step 208, if the initiator has received a response from the responder, the method follows the Yes branch from decisional step 208 to decisional step 212. At decisional step 212, the initiator makes a determination regarding whether or not the response received from the responder comprises a checkpoint acknowledge. If the response comprises a checkpoint acknowledge, the checkpoint procedure has been completed successfully and the method follows the Yes branch from decisional step 212 to step 214.

At step 214, the initiator stops the checkpoint timer. At step 216, the initiator returns to performing dictionary management in accordance with routine procedures, at which point the method comes to an end. In addition, according to one embodiment, the network station 14 may provide the checkpoint dictionary 58 to the compression server 20 for storage in the dictionary database 36 at this point.

Returning to decisional step 212, if the initiator determines that the response was not a checkpoint acknowledge, the method follows the No branch from decisional step 212 to step 218. At step 218, the initiator and the responder perform a rollback procedure, such as the one described below in connection with FIGS. 5A–B, at which point the method comes to an end.

The method of FIG. 4B begins at step 230 where the responder receives the checkpoint initiation from the initiator. At step 232, the responder attempts to validate the version of the dictionary to be stored in the checkpoint dictionary 58 as identified in the checkpoint initiation by the initiator. According to one embodiment, the responder may attempt to validate the dictionary by checking the error-detecting code for the dictionary against the error-detecting code that was received from the initiator for the corresponding dictionary in the initiator.

At decisional step 234, the responder makes a determination regarding whether or not the checkpoint dictionary 58 has been validated. If the checkpoint dictionary 58 has been validated, the method follows the Yes branch from decisional step 234 to step 236. At step 236, the responder stores the checkpoint dictionary 58 in its dictionary module 24. At step 238, the responder sends a checkpoint acknowledge to the initiator, at which point the method comes to an end. According to one embodiment, the checkpoint acknowledge comprises an indication that the checkpoint procedure has been completed successfully, in addition to any other suitable information.

Returning to decisional step 234, if the responder has not been able to validate the checkpoint dictionary 58, the method follows the No branch from decisional step 234 to step 240. At step 240, the responder may optionally send a checkpoint rejection to the initiator to indicate that the checkpoint procedure was unsuccessful. However, it will be understood that the responder may send any other suitable response to the initiator, such as a rollback initiation, to indicate that the checkpoint dictionary 58 has not been validated. At step 242, the initiator and the responder perform a rollback procedure, such as the one described below in connection with FIGS. 5A–B, at which point the method comes to an end.

Thus, in accordance with the method of FIGS. 4A–B, checkpoint dictionaries 58 that include copies of synchronized dictionaries 50, 52, 54 and/or 56 may be stored periodically or as a result of other suitable triggers. Thus, if synchronization is subsequently lost, a previously stored checkpoint dictionary 58 may be used to replace the unsynchronized dictionary or dictionaries 50, 52, 54 and/or 56, resulting in a significant increase in compression efficiency.

Figure 5A:
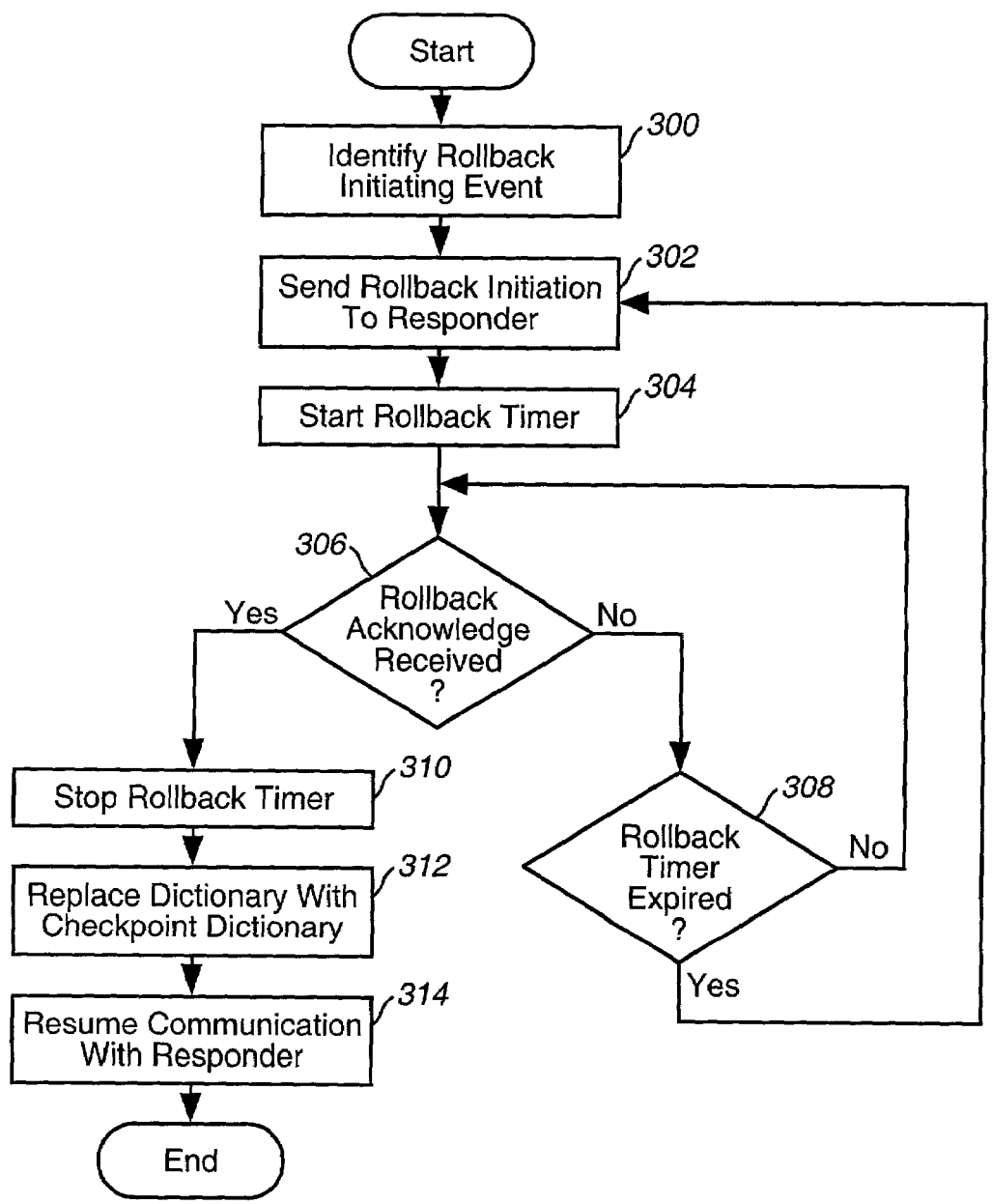
FIGS. 5A–B are flow diagrams illustrating a method for performing a rollback procedure to provide communication using the checkpoint dictionary of FIG. 2 in accordance with one embodiment of the present invention.
Figure 5B:
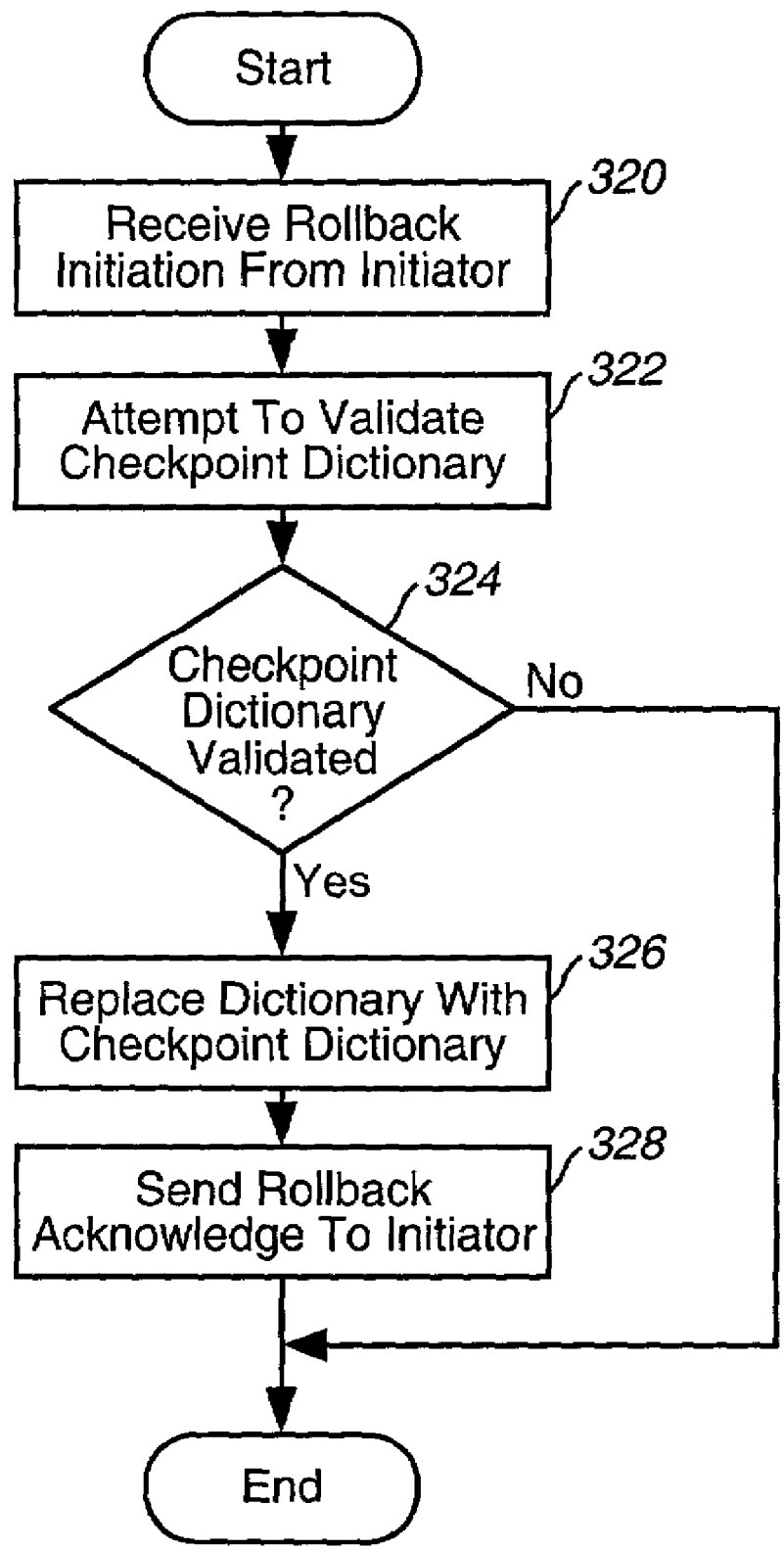

FIGS. 5A–B are flow diagrams illustrating a method for performing a rollback procedure to provide communication using a checkpoint dictionary 58 in accordance with one embodiment of the present invention. FIG. 5A illustrates the method from the perspective of the initiator, and FIG. 5B illustrates the method from the perspective of the responder. As described above in connection with FIGS. 4A–B, either the mobile station 12 or the network station 14 may be the initiator, resulting in the other station 12 or 14 being the responder.

The method of FIG. 5A begins at step 300 where the initiator identifies a rollback initiating event. According to one embodiment, a rollback initiating event may comprise a mismatch of error-detecting codes, a checkpoint rejection, or any other suitable event indicating that the dictionary modules 24a and 24b are not synchronized.

At step 302, the initiator sends a rollback initiation to the responder. According to one embodiment, the rollback initiation comprises an index value to identify the version of the dictionary stored in the checkpoint dictionary 58 to which the initiator would like to rollback, the error-detecting code for that version of the dictionary, and any other suitable information. At step 304, the initiator starts a rollback timer corresponding to a predetermined amount of time during which the initiator expects to receive a response to the rollback initiation from the responder.

At decisional step 306, the initiator makes a determination regarding whether or not a rollback acknowledge has been received from the responder. If no rollback acknowledge has been received from the responder, the method follows the No branch from decisional step 306 to decisional step 308.

At decisional step 308, the initiator makes a determination regarding whether or not the rollback timer has expired. If the rollback timer has not expired, the method follows the No branch from decisional step 308 and returns to decisional step 306 where the initiator determines whether or not a rollback acknowledge has been received.

However, if the rollback timer has expired, the method follows the Yes branch from decisional step 308 and returns to step 302 where the initiator sends another rollback initiation to the responder. In addition, a rollback counter may be incremented each time the rollback timer expires in order to limit the number of times a rollback initiation is sent before an error message is generated to indicate that the procedure is not progressing.

Returning to decisional step 306, if a rollback acknowledge has been received from the responder, the rollback procedure has been completed successfully and the method follows the Yes branch from decisional step 306 to step 310. At step 310, the initiator stops the rollback timer. At step 312, the initiator replaces the appropriate dictionary or dictionaries, such as the dynamic dictionary 52, with the version of the dictionary stored in the checkpoint dictionary 58 corresponding to the index value. At step 314, the initiator resumes communication with the responder, at which point the method comes to an end.

The method of FIG. 5B begins at step 320 where the responder receives the rollback initiation from the initiator. At step 322, the responder attempts to validate the version of the dictionary stored in the checkpoint dictionary 58 corresponding to the index value included in the rollback initiation by the initiator. According to one embodiment, the responder may attempt to validate the dictionary by checking the error-detecting code for the dictionary against the error-detecting code that was received from the initiator for the corresponding dictionary in the initiator.

At decisional step 324, the responder makes a determination regarding whether or not the version of the dictionary stored in the checkpoint dictionary 58 corresponding to the index value has been validated. If that version of the dictionary has been validated, the method follows the Yes branch from decisional step 324 to step 326. At step 326, the responder replaces the appropriate dictionary or dictionaries, such as the dynamic dictionary 52, with the version of the dictionary stored in the checkpoint dictionary 58 corresponding to the index value. At step 328, the responder sends a rollback acknowledge to the initiator, at which point the method comes to an end. According to one embodiment, the rollback acknowledge comprises an indication that the rollback procedure has been completed successfully, in addition to any other suitable information.

Returning to decisional step 324, if the responder has not been able to validate the version of the dictionary stored in the checkpoint dictionary 58 corresponding to the index value, the rollback procedure has been unsuccessful and the method follows the No branch from decisional step 324 and comes to an end.

Thus, in accordance with the method of FIGS. 5A–B, a previously stored checkpoint dictionary 58 may be used to replace an unsynchronized dictionary or dictionaries 52, 54 and/or 56 if synchronization is lost. As a result, compression efficiency is significantly increased.

Although the present invention has been described with several embodiments, various changes and modifications may be suggested to one skilled in the art. It is intended that the present invention encompass such changes and modifications as fall within the scope of the appended claims.

What is claimed is:

1. A method for providing wireless communication between a mobile station and a network station using a context for message compression, comprising:
   storing persistently signaling messages specific to a profile for a specific mobile station or user of a mobile station in a dictionary for storing signaling messages specific to a profile for a specific mobile station or user of a mobile station arranged to retain at least some of the stored messages for use during subsequent communication sessions; and
   providing communication between the mobile station and the network station using the dictionary for storing signaling messages specific to the profile for a specific mobile station or user of a mobile station for message compression.

2. The method of claim 1, the signaling messages specific to a profile for a specific mobile station or user of a mobile station comprising mobile station or network station information.

3. The method of claim 1, the signaling messages specific to a profile for a specific mobile station or user of a mobile station comprising user information.

4. The method of claim 3, further comprising storing the user information in an identity module, the identity module removable from the mobile station.

5. The method of claim 1, the dictionary for storing signaling messages specific to a profile for a specific mobile station or user of a mobile station comprising a plurality of dictionaries, and storing signaling messages specific to a profile for a specific mobile station or user of a mobile station in a dictionary for storing signaling messages specific to a profile for a specific mobile station or user of a mobile station comprising storing in each of the plurality of dictionaries signaling messages specific to a profile for a specific mobile station or user of a mobile station corresponding to one of the plurality of mobile stations.

6. The method of claim 1, further comprising:
   storing persistently signaling protocol-specific information in a static dictionary; and
   providing communication between the mobile station and the network station further comprising providing communication between the mobile station and the network station using the signaling protocol-specific dictionary for message compression.

7. The method of claim 1, further comprising:
   downloading compression/decompression code for at least one of a compressor operable to compress messages and a decompressor operable to decompress messages; and
   providing communication between the mobile station and the network station further comprising providing communication between the mobile station and the network station using the compression/decompression code.

8. A system for providing wireless communication between a mobile station and a network station using a context for message compression, comprising:
   a computer-processable medium; and
   logic stored on the computer-processable medium, the logic operable to store persistently signaling messages specific to a profile for a specific mobile station or user of a mobile station in dictionary for storing signaling messages specific to a profile for a specific mobile station or user of a mobile station and to provide communication between the mobile station and the network station using the dictionary for storing signaling messages specific to a profile for a specific mobile station or user of a mobile station for message compression, the dictionary being arranged to retain at least some of the stored messages for use during subsequent communication sessions.

9. The system of claim 8, the signaling messages specific to a profile for a specific mobile station or user of a mobile station comprising mobile station or network station information.

10. The system of claim 8, the signaling messages specific to a profile for a specific mobile station or user of a mobile station comprising user information.

11. The system of claim 8, the dictionary for storing signaling messages specific to a profile for a specific mobile station or user of a mobile station comprising a plurality of dictionaries, and the logic operable to store signaling messages specific to a profile for a specific mobile station or user of a mobile station in a dictionary for storing signaling messages specific to a profile for a specific mobile station or user of mobile station by storing in each of the plurality of dictionaries signaling messages specific to a profile for a specific mobile station or user of a mobile station corresponding to one of a plurality of mobile stations.

12. The system of claim 8, the logic further operable to store persistently signaling protocol-specific information in a static dictionary and to provide communication between the mobile station and the network station by providing communication using the signaling protocol-specific dictionary for message compression.

13. The system of claim 8, the logic further operable to download compression/depression code for at least one of a compressor operable to compress messages and a decompressor operable to decompress messages and to provide communication between the mobile station and the network station by providing communication using the compression/depression code.

14. A method for providing a dictionary for message compression, comprising:
   receiving, by a network station, a setup message from a mobile station;
   based on the setup message, searching for a common dictionary by the network station;
   attempting to validate the common dictionary by the network when the common dictionary is found by the network station, for checking that the common dictionary at the network station corresponds in content to a corresponding dictionary at the mobile station;
   providing a common dictionary identifier associated with the common dictionary from the network station to the mobile station when the common dictionary is validated by the network station; and
   communicating with the mobile station using the common dictionary.

15. The method of claim 14, further comprising:
   requesting the common dictionary from a compression server when no common dictionary is found; and
   requesting the common dictionary from the compression server when the common dictionary is not validated.

16. The method of claim 15, further comprising:
   receiving the common dictionary from the compression server; and
   providing a common dictionary identifier associated with the common dictionary to the mobile station when the common dictionary is received from the compression server.

17. The method of claim 14, the common dictionary comprising a dictionary for storing signaling messages specific to a profile for a specific mobile station or user of a mobile station.

18. The method of claim 17, the dictionary for storing signaling messages specific to a profile for a specific mobile station or user of a mobile station operable to store persistently signaling messages specific to a profile for specific mobile station or user of a mobile station, the signaling messages specific to a profile for a specific mobile station or user of a mobile station comprising mobile station or network station information.

19. The method of claim 17, dictionary for storing signaling messages specific to a profile for a specific mobile station or user of a mobile station operable to store persistently signaling messages specific to a profile for specific mobile station or user of a mobile station, the signaling messages specific to a profile for a specific mobile station or user of a mobile station comprising user information.

20. The method of claim 17, the dictionary for storing signaling messages specific to a profile for a specific mobile station or user of a mobile station comprising a plurality of dictionaries, each of the plurality of dictionaries operable to store persistently signaling messages specific to a profile for a specific mobile station or user of a mobile station corresponding to one of a plurality of mobile stations.

21. The method of claim 14, the common dictionary comprising a static dictionary, the static dictionary operable to store persistently signaling protocol-specific information comprising communication Session Initiation Protocol information.

22. A station for providing wireless communication using message compression, comprising:
   a dictionary module operable to store a plurality of dictionaries, each dictionary operable to store a plurality of signaling message strings, one of the dictionaries comprising a dictionary for storing signaling messages specific to a profile for a specific mobile station or user of a mobile station, the dictionaries arranged to retain at least some of the stored messages for use during subsequent communication sessions;
   a compressor coupled to the dictionary module, the compressor operable to generate a first reference value corresponding to a first string in a first signaling message that is to be communicated and to communicate the first reference value instead of the first string; and
   a decompressor coupled to the dictionary module, the decompressor operable to receive a second reference value and to recover a second string in a second signaling message based on the second reference value.

23. The station of claim 22, the dictionary for storing signaling messages specific to a profile for a specific mobile station or user of a mobile station operable to store persistently signaling messages specific to a profile for a specific mobile station or user of a mobile station, the signaling messages specific to a profile for a specific mobile station or user of a mobile station comprising mobile station or network station information.

24. The station of claim 22, the dictionary for storing signaling messages specific to a profile for a specific mobile station or user of a mobile station operable to store persistently signaling messages specific to a profile for a specific mobile station or user of a mobile station, the signaling messages specific to a profile for a specific mobile station or user of a mobile station comprising user information.

25. The station of claim 24, dictionary for storing signaling messages specific to a profile for a specific mobile station or user of a mobile station comprising an identity module operable to store persistently the user information, the identity module removable from the station.

26. The station of claim 22, the dictionary for storing signaling messages specific to a profile for a specific mobile station or user of a mobile station comprising a plurality of dictionaries, each of the plurality of dictionaries operable to store persistently signaling messages specific to a profile for a specific mobile station or user of a mobile station corresponding to one of a plurality of mobile stations.

27. The station of claim 22, a second one of the dictionaries comprising a static dictionary, the static dictionary operable to store persistently signaling protocol-specific information, the signaling protocol-specific information comprising communication Session Initiation Protocol information.

* * * * *